United States Patent [19]
Kennedy

[11] Patent Number: 4,628,992
[45] Date of Patent: Dec. 16, 1986

[54] INDUCED FLOW HEAT EXCHANGER
[75] Inventor: Kevin J. Kennedy, Sea Girt, N.J.
[73] Assignee: AT&T Information Systems, Morristown, N.J.
[21] Appl. No.: 572,996
[22] Filed: Jan. 23, 1984
[51] Int. Cl.⁴ .............................................. F28F 13/06
[52] U.S. Cl. ................................. 165/123; 165/80.3; 165/128; 361/384
[58] Field of Search .............. 165/122, 123, 124, 139, 165/80 B, 121, 129, 128, 80.3; 361/383, 384

[56] References Cited
U.S. PATENT DOCUMENTS

| | | | |
|---|---|---|---|
| 2,552,837 | 5/1951 | Blazer | 165/55 X |
| 3,196,940 | 7/1965 | Saslow et al. | 165/121 X |
| 4,093,021 | 6/1978 | Groom | 165/80 B X |
| 4,103,737 | 8/1978 | Perkins | 361/384 X |
| 4,277,816 | 7/1981 | Dunn et al. | 361/384 |
| 4,291,364 | 9/1981 | Andros et al. | 165/80 B X |
| 4,296,455 | 10/1981 | Leaycraft et al. | 165/DIG. 11 X |
| 4,379,446 | 4/1983 | Porter | 165/124 X |
| 4,393,437 | 7/1983 | Bell et al. | 361/384 X |
| 4,399,485 | 8/1983 | Wright et al. | 361/384 X |
| 4,415,023 | 11/1983 | Vandervaart | 165/29 X |
| 4,417,295 | 11/1983 | Stuckert | 165/123 X |

FOREIGN PATENT DOCUMENTS 2308075 11/1976 France ............................... 165/123
285938 1/1971 U.S.S.R. ............................. 165/128

OTHER PUBLICATIONS

"Cold Plate with Metal Base and Molded Plastic Shell for Circuit Module", *IBM Technical Disclosure Bulletin*, vol. 24, No. 8, Jan. 1982, by K. P. Moran and D. D. Stenabaugh.

Primary Examiner—Albert W. Davis, Jr.
Assistant Examiner—Randolph A. Smith
Attorney, Agent, or Firm—Barry H. Freedman; Frederick B. Luludis

[57] ABSTRACT

In order to cool heat generating components on an electronic assembly without contamination by particles carried in a cooling gas stream, a cold plate is disposed adjacent the assembly, defining a gap region therebetween. The cooling gas is directed in proximity to the cold plate, dissipating heat transferred from the components to the plate. To enhance overall heat dissipation of the apparatus, an aperture is defined between the gap region and the gas stream, so that a negative pressure is induced in the gap by virtue of the Bernoulli principle. This pressure difference induces convection within the gap, increasing heat flow between the components and the plate, and resulting in overall improvement in heat dissipation. Embodiments in which the gas stream flow is parallel and transverse to the cold plate are described.

12 Claims, 5 Drawing Figures

INDUCED FLOW HEAT EXCHANGER

FIELD OF THE INVENTION

This invention relates to a technique and apparatus for cooling an electronic assembly, and in particular, to cooling of an electronic assembly by use of a cold plate and induced forced convection of air or another gas.

BACKGROUND OF THE INVENTION

With the increased packing density of heat generating elements now obtainable in an electronic assembly, thermal design considerations have taken on greater significance. In order to provide sufficient heat dissipation, passive cooling may have to be augmented by a forced convection system using a blower fan or other source of a cooling gas stream. Typically, the cooling gas is air, but design considerations may sometimes dictate the use of another gas. In the following description, reference to "air" should thus be construed broadly to include alternative gasses.

When a fan or blower is used, air borne contaminants are brought into contact with the components of the electronic assembly at a rapid rate, sometimes decreasing performance or resulting in an increased likelihood of malfunctions. Indeed, the dirt problem is so significant that direct contact, forced air systems are not generally permitted within electronic assemblies destined for use in military applications. See, for example, MIL-STD 454.

To avoid the dirt problem and still provide the desired degree of forced air or convection cooling, resort may be had to an indirect cooling technique which uses a "cold plate". In such an arrangement, a heat conductive, usually metal cold plate is disposed adjacent to the electronic assembly so as to define a narrow, usually sealed, region or gap between one surface of the plate and one surface (usually bearing the heat generating elements) of the assembly. Heat generated in the assembly is carried to the cold plate, generally by radiation, conduction and/or free convection. A fan or blower is arranged to generate an air stream adjacent to the other (exterior) surface of the plate, so as to effect heat exchange between the plate and the forced air stream. Since the air stream does not directly enter the gap or contact the assembly, the dirt buildup problem is thus eliminated.

While the use of a cold plate has satisfactorily enabled cooling of electronic assemblies without dirt contamination, the amount of dissipation provided by this technique is sometimes insufficient. To increase dissipation, it is often necessary to increase the air movement capacity of the fan, increase the heat transfer areas, (i.e., enclosure size, cold plate size), or to use heat sinks, all with added costs. In addition, enhanced dissipation can be achieved by increasing the efficiency of heat transfer from the assembly to the cold plate, typically by introduction of a very small amount of air flow in the gap. By limiting the air velocity in the gap to an amount which is less than or equal to that associated with free convection between vertical parallel plates, significant dirt contamination is still avoided.

The latter alternative is sometimes difficult to implement, since devices which produce low volume air flow (such as miniature fans or piezo-electric resonators) are often expensive. Introduction of a small opening in the head end of the gap region (between the assembly and the cold plate) so as to produce a small positive air pressure differential in that region may work satisfactorily, but this arrangement requires that the same air source be used for both cooling of the exterior surface of the cold plate and for the introduction of a low velocity flow in the gap region, which may be a disadvantage in some circumstances.

In view of the foregoing, it is the broad object of the present invention to provide efficient cooling of electronic assemblies without contamination by dirt or dust. In particular, it is desired to achieve the advantages attained by use of a cold plate, while significantly increasing the amount of heat which may be dissipated. It is also desired to induce a low velocity gas flow in the gap between an electronic assembly and a cold plate using the same fan or blower used to cool the exterior surface of the cold plate, while permitting a different gas source to enter the gap.

SUMMARY OF THE INVENTION

The foregoing objects are achieved in accordance with the present invention by disposing one side of a heat conductive cold plate adjacent to a heat generating electronic assembly so as to define a generally closed air gap volume therebetween. A gas stream, typically air, generated by a fan or other similar means is directed in proximity to the other (exterior) side of the cold plate, so as to dissipate heat from the plate by normal forced convection principles, without directly entering the gap volume, which could contaminate the heat generating components which make up the electronic assembly. In addition, the air source is positioned so that the air stream passes over an aperture (formed in or by the plate) which permits communication between the gap volume and the air stream. Passage of air across the aperture induces, by virtue of the Bernoulli principle, a negative pressure in the aperture and consequent induced air flow in the gap, enhancing heat transfer between the assembly and the cold plate and ultimately resulting in significant additional heat dissipation. In a first embodiment, the air stream is directed generally parallel to the surface of the cold plate, and the aperture is formed in the plate at a relatively downstream location with respect to the air source. In a second embodiment, the air stream is directed in a generally transverse direction with respect to the plate, and the aperture is defined by corresponding edges of the plate and the assembly.

Since the air flow within the air gap is small (on the order of free convection between vertical parallel plates), the amount of air-borne dirt remains at an acceptable small level. The air or other gas entering the gap may advantageously be provided from a source different from that used to generate the higher velocity air stream that directly contacts the cold plate.

BRIEF DESCRIPTION OF THE DRAWING

The features and advantages of the instant invention will be fully appreciated by reference to the following detailed description, when read in light of the accompanying drawing in which.

DETAILED DESCRIPTION

Figure 1:
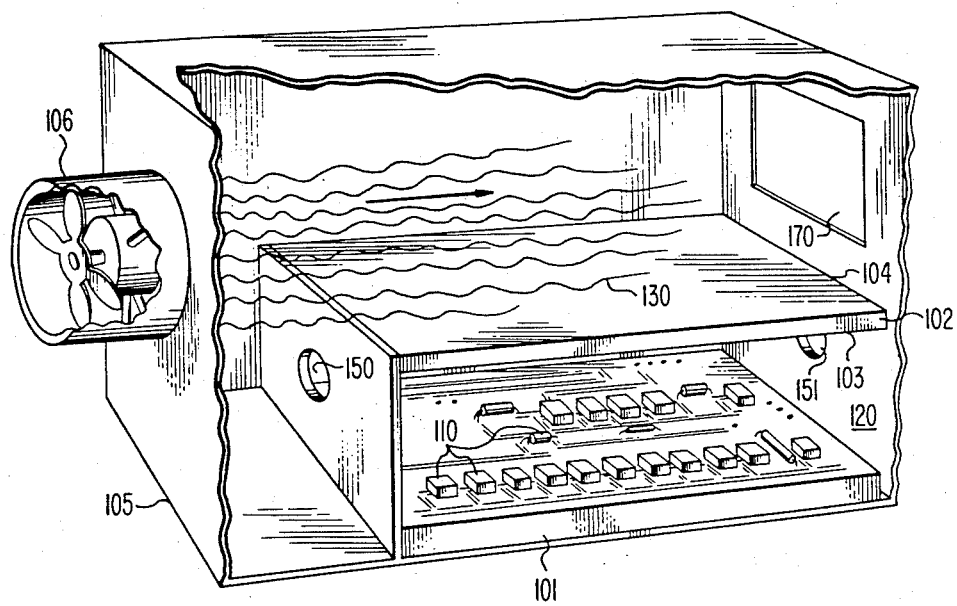
FIG. 1 illustrates a conventional technique for cooling an electronic assembly using a cold plate.

Referring first to FIG. 1, there is illustrated a conventional arrangement for dissipating heat in an electronic assembly using a cold plate and forced air convection. As shown, an electronic assembly 101 such as a printed circuit board includes a number of heat generated devices 110 affixed thereto. Disposed adjacent to the surface of assembly 101 that bears devices 110, is a cold plate 102, generally fabricated from a heat conductive metal such as aluminum. Plate 102 and assembly 101 are held in position by a housing 105 such that a first surface 103 of plate 102 and one surface of assembly 101 define an air gap volume designated generally at 120. Gap 120 is generally sealed at its ends and sides by portions of housing 105 or otherwise, so that air flow with the region is either limited or completely prevented. The portion of housing 105 that would define the front surface of volume 120 is removed in FIGS. 1 and 2 for the purpose of illustration.

When devices 110 are active, heat generated by the devices is carried by convection and radiation from assembly 101 to plate 102. This heat is then dissipated by disposing a fan, blower or other air source 106 such that its air stream 130 is directed adjacent the second (exterior) surface 104 of plate 102; heated air exits housing 105 via a large opening 170 formed therein. By virtue of the arrangement shown in FIG. 1, in which air gap volume 120 and openings 150 and 151 are sealed, it is seen that air stream 130 does not directly impinge on devices 110 or assembly 101. Accordingly, contamination of devices 110 by air-borne dirt is avoided.

The heat flow pattern generated within air gap 120 in the arrangement of FIG. 1 depends upon several factors, including the temperature difference $\Delta t$ between the surface of assembly 101 which bears elements 110 and surface 103 of plate 102, the spacing $\delta$ between these surfaces, the isobaric compressibility (volume coefficient of expansion) $\beta$ of the cooling gas, and the kinematic viscosity $\gamma$ of the gas. One non-dimensional numeric quantifier which is pertinent to understanding the heat flow pattern is the Grashof number $G_r$, which is given by $$G_r = g\beta\Delta t(\delta^3/\gamma^2),$$

where g is the force of gravity. For geometries where $G_r < 1700$, it has been found that conduction and radiation are the only mechanisms for heat transfer between assembly 101 and plate 102. On the other hand, for $G_r > 1700$, cellular convection occurs, as illustrated in the side cut-away view of FIG. 4, in which like components retain the same reference designations. As shown, flow within gap 120 is confined to a relatively small, recirculatory pattern 401 of stagnant air. This type of flow achieves slightly better heat transfer, since the hot air generated by elements 110 rises to plate 102, transfers energy and is cooled, and then drops to begin the cycle again. Nonetheless, this arrangement is relatively ineffective in transferring large amounts of heat from components 110 to plate 102.

To improve the heat dissipation characteristics of the arrangement of FIG. 1, it is known to form small openings 150, 151 communicating with air gap 120, and to introduce a relatively small air flow directly into the region by directing a small portion of the air from stream 130 toward opening 150. This alternative will cause a small amount of contamination to the devices 110 of assembly 101. However, since the air velocity within gap 120 is quite low, heavier dirt particles will not be carried in stream 130; indeed, it is possible to arrange openings 150 and 151 and air source 106 so that the flow within gap 120 is no more than that which would occur by normal convection in an open environment.

In the alternative just discussed, it is noted that air from the same stream 130 is used for both cooling surface 104 of plate 102 and for introducing a flow of air within gap 120, which may not be desirable in certain instances. Furthermore, the physical layout of housing 105, air source 106 and the remaining components shown in FIG. 1 may preclude direct application of a positive pressure differential across openings 150 and 151.

Figure 2:
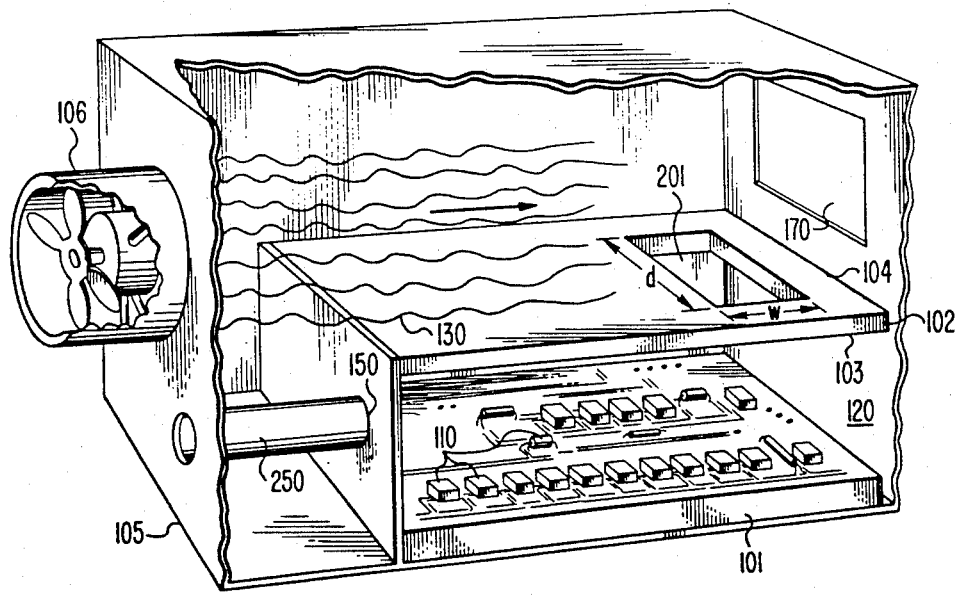
FIG. 2 illustrates a first embodiment of the present invention in which a horizontally disposed cold plate is used to dissipate heat in an electronic assembly.

In accordance with the present invention, as illustrated in FIG. 2, in which like elements again retain the same designations as in FIG. 1, an aperture 201 permitting communication between air stream 130 and air gap 120 is formed in cold plate 102, preferably near the end of plate 102 farthest from air source 106. The area of aperture 201 is generally small compared to the overall area of plate 102, as is discussed more fully below. The purpose of aperture 201 is not to introduce air into the region of gap 120; rather, the high velocity flow in air stream 130 across this opening creates a negative pressure, with respect to opening 150 formed in housing 105. This negative pressure differential is formed by virtue of the well known Bernoulli principle, and sets up a low velocity air flow in gap 120, significantly improving the heat transfer and dissipation properties of the arrangement.

Figure 4:
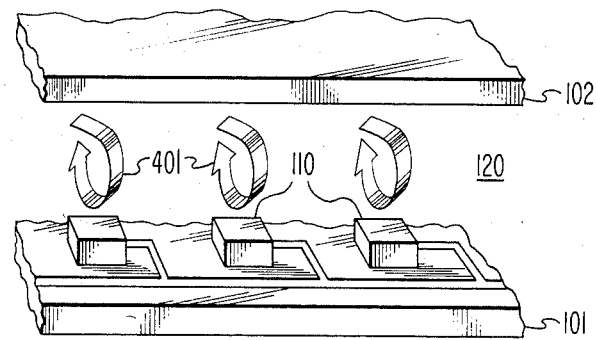
FIGS. 4 and 5 illustrate the heat convection flow in the air gaps of the arrangements of FIGS. 1 and 2, respectively.
Figure 5:
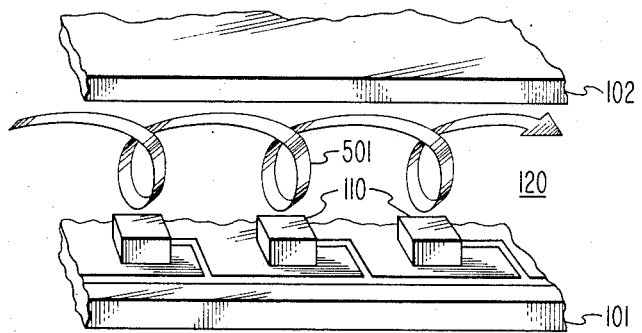

The improvement occasioned by the arrangement of FIG. 2 can be appreciated by reference to FIG. 5, which is a side cut-away view of the arrangement of FIG. 2, depicted in a manner similar to FIG. 4. As can be seen, the heat convection pattern induced in gap 120 (by virtue of the provision of aperture 201 and the passage of air stream 130 over the aperture) now takes the form of a longitudinal vortex roll 501. This pattern induces an overall left to right motion beginning at the end of gap 120 nearest opening 150 and extending longitudinally in gap 120 toward aperture 201. This type of flow minimizes the abrupt deceleration associated with the cellular recirculating flow shown in FIG. 4 because the flow can now respond in a new (longitudinal) dimension. As a result, a greatly enhanced heat transfer characteristic is obtained as compared to that of the cellular convection produced by the arrangement of FIG. 1.

The design factors which affect the heat dissipation provided by the arrangement of FIG. 2 include the spacing $\delta$ and temperature difference $\Delta t$ between assembly 101 and plate 102, and the system resistance to flow within gap 120. In particular, an increase in $\delta$ enhances motion and heat transfer, while lowering the cold plate temperature has a second order effect, constrained by the ambient temperature. System resistance depends upon several factors, including the length of the gap, the boundary roughness determined by the ratio of the height of elements 110 to the channel height $\delta$, and both the abruptness and size of aperture 201 and opening 150. Preferably, aperture 201 is dimensioned to have a depth d (see FIG. 2) which is nearly equal to the width of plate 102. By locating aperture 201 at the downstream end of plate 102, the abruptness of the flow patterns in gap 120 is reduced. The width w of aperture 201 can be varied in accordance with the flow rate induced by fan 106: higher rates increase the pressure differential between the aperture and opening 150, and thus minimizes the required width of aperture 201.

As illustrated in FIG. 2, the arrangement of the present invention does not rely upon introduction of a positive pressure differential induced by the air flow generated by source 106 at the opening 150. Accordingly, it is not necessary that the same air source be used for generating air stream 130 and for generating the induced flow in gap 120. Specifically, as shown in FIG. 2, the air supplied to opening 150 can originate at a location separated by virtue of air channel 250, and, indeed, a cooling gas or specially cleaned air can be easily introduced within the region between plate 102 and assembly 101, if desired.

Figure 3:
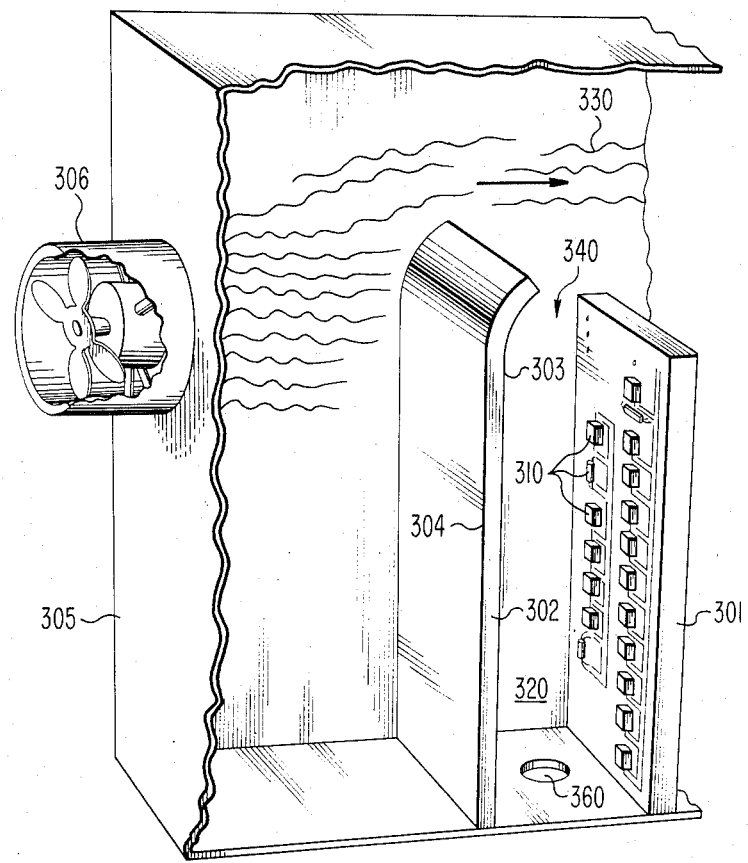
FIG. 3 illustrates another embodiment in which a vertical arrangement of electronic assembly and cold plate is used.

The present invention can be practiced in connection with a vertical rather than horizontal positioning of assembly 101 and plate 102, as illustrated in FIG. 3. As shown, in this arrangement, a cold plate 302 is disposed adjacent an electronic assembly 301 such that a first side 303 of the plate and the surface of the assembly which contains a series of electronic devices 310 define an air gap volume 320. A housing 305 is arranged to hold assembly 301 and plate 302 in proper alignment, and to also support a blower or fan 306 which provides an air stream 330 in a direction generally transverse to the air gap volume 320. This air stream provides direct convection cooling of the exterior surface 304 of plate 302 in a conventional manner. In addition, however, plate 302 is arranged so that an aperture indicated generally at 340 is formed between the air stream 330 and the air gap volume 320. As in the embodiment of FIG. 2, passage of air stream 330 across this aperture induces, by virtue of the Bernoulli principle, a negative differential between the pressure at the aperture and the pressure at another small opening 360 formed in housing 305 and communicating with volume 320. As a consequence of this differential, a small amount of convection is induced in the air gap, considerably aiding in heat transfer between devices 301 and plate 302. In this arrangement, the source of air (or other cooling gas) permitted to enter volume 320 via opening 360 may also be separate and distinct from the source which supplies air stream 330.

Various modifications and adaptations of the present invention will be apparent to those skilled in the art, and, for that reason, it is intended that the invention be limited only by the scope of the appended claims. For example, it is well known to include a stack of several electronic circuits between two cold plates; with such a "sandwich" arrangement, an aperture communicating with the air stream may still be formed so as to create a negative pressure at the aperture and induce a convection air flow in the air gap volume within the sandwich structure. In addition, it is clear that deflectors, filters, and other orifices could be added to the structure, without departing from the present teachings.

What is claimed is:

1. Apparatus including
   an electronic assembly which includes heat generating elements,
   a heat conductive cooling plate disposed in a generally parallel direction relative to said electronic assembly, said cooling plate having first and second sides, said first side disposed adjacent to said electronic assembly and defining a gap between said plate and said assembly, and
   means for generating a moving stream of cooling gas adjacent to said second side of said cooling plate,
   wherein said cooling plate defines an aperture which permits communication between said gas stream and said gap,
   whereby a convection current within said gap and gas flow out of said aperture is induced by passage of said gas stream over said aperture.

2. The invention defined in claim 1 wherein
   said gas stream flows in a direction generally parallel to said cooling plate, and
   said aperture is defined by an opening in the surface of said cooling plate.

3. The invention defined in claim 1 wherein
   said gas stream flows in a direction generally transverse to said electronic assembly, and
   said aperture is defined by corresponding edges of said cooling plate and said electronic assembly.

4. The invention defined in claim 1 further including means for introducing a cooling gas in said gap from a source other than said gas stream.

5. Apparatus for cooling heat generating elements, including
   means for maintaining said heat generating elements in a generally planar array,
   a heat conductive cooling plate having first and second surfaces,
   means for disposing said first surface adjacent and generally parallel to said maintaining means to define a generally closed air gap between said plate and said assembly, and
   means for generating an air stream adjacent to said second surface of said cooling plate which communicates with said air gap via an aperture defined by said cooling plate,
   whereby a convection air current within said gap and out of said aperture is induced by passage of said air stream over said aperture.

6. The apparatus defined in claim 5 wherein said disposing means includes a housing arranged to maintain said cooling plate and said electronic assembly in generally parallel alignment.

7. The apparatus defined in claim 6 wherein said aperture is defined by an opening in the surface of said cooling plate.

8. The apparatus defined in claim 6 wherein said aperture is defined by at least one edge of said cooling plate and said assembly.

9. Apparatus comprising
   an electronic assembly including heat generating elements,
   a heat conductive cold plate,
   housing means for disposing a first side of said cold plate in spaced parallel relation to a surface of said electronic assembly, said housing and said plate together defining a generally closed gap region, and
   means for generating a gas stream adjacent to a second side of said cooling plate,
   wherein said cold plate defines an aperture permitting communication between said gas stream and said gap region, whereby a convection current within said gap and exiting from said aperture is induced by passage of said gas stream over said aperture.

10. Apparatus comprising
a circuit board containing heat generating elements,
a cold plate constructed of a heat conductive material,
means for positioning a first side of said cold plate in parallel relation to a major surface of said circuit board, said housing and said plate together defining a gap region therebetween, and
means for generating an air stream in parallel relation to a second side of said cooling plate,
wherein said cold plate defines an aperture communicating between said air stream and said air gap region, so that a convection air current within said gap and out of said aperture is induced by passage of said air stream over said aperture,
whereby heat transfer between said heat generating elements and said cold plate is enhanced.

11. Apparatus for cooling an electronic assembly which includes heat generating elements, comprising
a heat conductive cooling plate having first and second sides, said first side disposed adjacent to said electronic assembly and defining a gap between said plate and said assembly, said cooling plate defining an aperture which permits communication between a generated stream of cooling gas and said gap, and
means for generating said gas stream, said means arranged to induce a convection current within said gap and gas flow out of said aperture by passage of said cooling gas stream adjacent to said second side of said cooling plate and over said aperture.

12. Apparatus for cooling an electronic assembly which includes heat generating elements, comprising
a heat conductive cooling plate having first and second sides, said first side disposed adjacent to said electronic assembly and defining a gap between said plate and said assembly,
means for generating a stream of cooling gas adjacent to said second side of said cooling plate, and
means for inducing a convection current within said gap, said inducing means including an aperture defined by said cooling plate permitting communication between said gas stream and gas in said gap so that passage of said cooling gas stream adjacent to said second side of said cooling plate and over said aperture creates a negative pressure differential in said aperture.

* * * * *